(12) United States Patent
Boesl

(10) Patent No.: US 11,149,908 B1
(45) Date of Patent: Oct. 19, 2021

(54) LIGHT EMITTING FILAMENT DEVICE AND METHOD OF MANUFACTURING A LIGHT EMITTING FILAMENT DEVICE

(71) Applicant: OSRAM OLED GmbH, Regensburg (DE)

(72) Inventor: Florian Boesl, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 17/265,093

(22) PCT Filed: Jul. 30, 2019

(86) PCT No.: PCT/EP2019/070517
§ 371 (c)(1),
(2) Date: Feb. 1, 2021

(87) PCT Pub. No.: WO2020/025622
PCT Pub. Date: Feb. 6, 2020

(30) Foreign Application Priority Data

Aug. 2, 2018 (DE) .................... 10 2018 118 822.6

(51) Int. Cl.
*F21K 9/64* (2016.01)
*F21K 9/69* (2016.01)
(Continued)

(52) U.S. Cl.
CPC .................. *F21K 9/64* (2016.08); *B60Q 1/56* (2013.01); *F21K 9/69* (2016.08); *F21K 9/90* (2013.01); *F21Y 2115/10* (2016.08)

(58) Field of Classification Search
CPC ..... F21K 9/64; F21K 9/69; F21K 9/90; B60Q 1/56; F21Y 2115/10
See application file for complete search history.

(56) References Cited

U.S. PATENT DOCUMENTS 8,210,716 B2 * 7/2012 Lerman ................. F21V 19/005
362/249.02
9,231,171 B2 * 1/2016 Liu ......................... F21K 9/232
(Continued)

FOREIGN PATENT DOCUMENTS

CN 204477771 U 7/2015
WO 2014/114241 A1 7/2014
(Continued)

OTHER PUBLICATIONS

International Search Report issued for corresponding International Patent Application No. PCT/EP2019/070517 dated Oct. 21, 2019, along with an English translation.
(Continued)

*Primary Examiner* — Evan P Dzierzynski
(74) *Attorney, Agent, or Firm* — Hauptman Ham, LLP

(57) ABSTRACT

A light emitting filament device comprising a carrier extending in a longitudinal direction and having a first main surface, a second main surface opposite to the first main surface, and two side surfaces interconnecting the two main surfaces. Optoelectronic components are disposed on the first main surface of the carrier. A first converter layer is arranged on the first main surface of the carrier and covers the optoelectronic components. A second converter layer is arranged on the second main surface of the carrier. The carrier is designed at at least one location along the longitudinal direction such that at least one of the two side surfaces includes an angle with the first main surface of greater than 90°. The carrier is trapezoidal in cross-section at the at least one location.

14 Claims, 4 Drawing Sheets

Figure 1A:
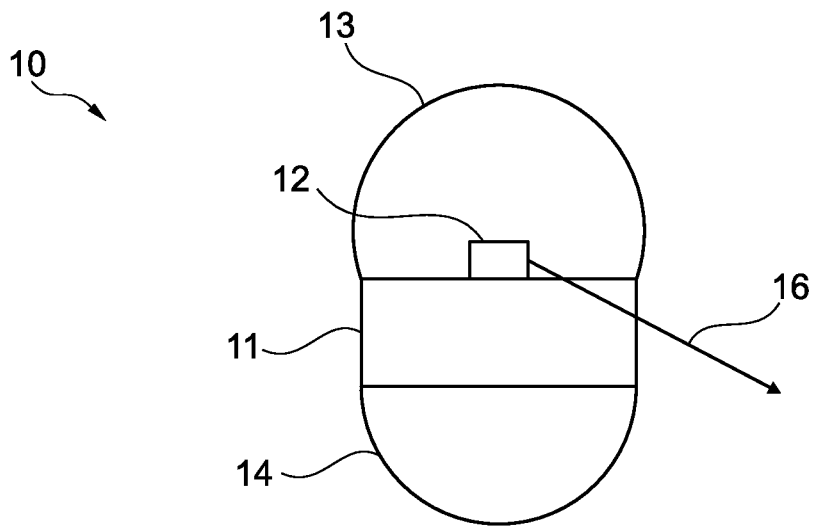

(51) Int. Cl.
*B60Q 1/56* (2006.01)
*F21K 9/90* (2016.01)
*F21Y 115/10* (2016.01)

(56) References Cited

U.S. PATENT DOCUMENTS

| | | | |
|---|---|---|---|
| 9,679,879 B2* | 6/2017 | Zhu | H01L 33/641 |
| 10,976,009 B2* | 4/2021 | Jiang | F21V 15/04 |
| 2004/0042233 A1 | 3/2004 | Suzuki et al. | |
| 2011/0058372 A1 | 3/2011 | Lerman et al. | |
| 2015/0069442 A1 | 3/2015 | Liu et al. | |
| 2015/0364452 A1 | 12/2015 | Zhu | |

FOREIGN PATENT DOCUMENTS

| | | |
|---|---|---|
| WO | 2017/162530 A1 | 9/2017 |
| WO | 2017/162821 A2 | 9/2017 |

OTHER PUBLICATIONS

Written Opinion issued for corresponding International Patent Application No. PCT/EP2019/070517 dated Oct. 21, 2019.

* cited by examiner

LIGHT EMITTING FILAMENT DEVICE AND METHOD OF MANUFACTURING A LIGHT EMITTING FILAMENT DEVICE

CROSS REFERENCE TO RELATED APPLICATION

This application is a National Stage of International Application No. PCT/EP2019/070517, filed on Jul. 30, 2019, which designates the United States and was published in Europe, and which claims priority to German Patent Application No. 10 2018 118 822.6, filed on Aug. 2, 2018, in the German Patent Office. Both of the aforementioned applications are hereby incorporated by reference in their entireties.

The present invention relates to a light emitting filament device and a method of manufacturing a light emitting filament device.

Light emitting filament devices, also called LED filaments, are rod-shaped light emitting optoelectronic devices with a transparent carrier on which optoelectronic components, such as LEDs (light emitting diodes), are mounted.

The light spectrum emitted by light emitting filament devices can have inhomogeneities. In particular, this problem can occur when using optoelectronic devices that emit blue light.

The present invention is based, among other things, on the object of creating a light emitting filament device which can be manufactured inexpensively and also has a comparatively high color homogeneity. Furthermore, a method for manufacturing a light emitting filament device is to be disclosed.

An object of the invention is solved by a light emitting filament device having the features of claim 1. An object of the invention is further solved by a lighting device having the features of claim 10, a license plate lighting device for a motor vehicle having the features of claim 11, and a method for producing a light emitting filament device having the features of claim 12. Preferred embodiments and further developments of the invention are given in the dependent claims.

A light emitting device comprises a carrier, also called a substrate, which extends in a longitudinal direction and which has a first main surface, a second main surface opposite to the first main surface, and two side surfaces connecting the two main surfaces. A plurality of optoelectronic components adapted to emit light are disposed on the first main surface of the carrier. Further, a first converter layer is disposed on the first main surface of the carrier and at least partially covers the first main surface. The first converter layer further covers the optoelectronic components. A second converter layer is arranged on the second main surface of the carrier, which at least partially covers the second main surface.

The carrier is configured in at least one location along the longitudinal direction such that at least one of the two side surfaces includes an angle with the first main surface of greater than 90°.

At the at least one location along the longitudinal direction, a sectional plane through the carrier can be viewed perpendicular to the longitudinal direction. In particular, in this sectional plane, the cross-section of the carrier is designed such that the at least one of the two side surfaces includes an angle with the first main surface of greater than 90°. In particular, the angle is smaller than 180°.

The angle can be measured from the inside of the first main surface to the inside of at least one of the two side surfaces.

Along the longitudinal direction, i.e., the longitudinal extent of the carrier, there may be a plurality of locations at each of which the cross-section of the carrier is designed such that the at least one of the two side surfaces includes an angle with the first main surface of greater than 90°.

The carrier may extend linearly along the longitudinal direction or be twisted or wound in itself. In the case of linear extension, the cross-section of the carrier may satisfy the above condition at several locations, i.e., at least one of the two side surfaces includes an angle with the first main surface of greater than 90° at these locations. In this case, the cross sections continue to be oriented in the same way, since the carrier extends linearly. If the carrier is twisted or wound in itself along the longitudinal direction and is, for example, helical or helix-shaped, the cross-section of the carrier may also satisfy the above condition at several locations along its longitudinal extension. In this case, however, the cross-sections of the carrier are twisted against each other at the respective locations.

Further, in a particularly contiguous area, the carrier may be designed such that at any location of the area, the at least one of the two side surfaces includes an angle with the first main surface of greater than 90°.

This area may comprise at least 70% or 80% or 90% or 100% or some other percentage of the length of the carrier in the longitudinal direction. However, particularly at the two end regions of the carrier, the carrier may be configured differently to provide attachment means by which the carrier or the light emitting filament device may be attached to other components.

In particular, the carrier is transparent or made of a transparent material. Corresponding materials are mentioned further below. Transparent in this context means that the carrier is substantially transparent at least for a part of the light emitted by the optoelectronic components or at least for light in a certain wavelength range, so that the light of this wavelength range is absorbed as little as possible by the carrier itself.

The optoelectronic components can emit light in the visible range, ultraviolet (UV) light, and/or infrared (IR) light.

Furthermore, the optoelectronic components can be optoelectronic semiconductor components, in particular semiconductor chips. For example, the optoelectronic components can each be designed as a light emitting diode (LED), an organic light emitting diode (OLED), a light emitting transistor or an organic light emitting transistor. The optoelectronic components can also be part of an integrated circuit.

In addition to the optoelectronic components, other semiconductor devices and/or other components may be integrated into the light emitting filament device.

The first and second converter layers are designed to convert the light emitted by the optoelectronic components into light with a different wavelength. In other words, the converter layers are designed to convert a primary radiation generated by the optoelectronic components. Primary radiation entering the respective converter layer is at least partially converted into secondary radiation by the converter layer. The secondary radiation comprises wavelengths which differ from the wavelengths of the primary radiation, i.e. which are longer or shorter than the wavelengths of the primary radiation.

The converter layers can contain converter elements or particles which effect the conversion of the light emitted by the optoelectronic components. The converter elements or particles can be embedded in another material or matrix, for example silicone.

The light emitting filament device can comprise exactly one carrier, or a plurality of carriers, each of which is constructed as described in the present application and to which optoelectronic components and a first and a second converter layer are applied.

The design of the carrier promotes total internal reflection (TIR) of the light emitted by the optoelectronic components on one or both side surfaces of the carrier, so that as little light as possible escapes through the side surface(s). This increases the color homogeneity of the light emitted by the light emitting filament device and makes it possible to manufacture the carrier from a low-cost material, thereby reducing the manufacturing costs of the light emitting filament device.

According to one embodiment, the outer side of the at least one of the two side surfaces is partially or completely exposed at the at least one location. In particular, the outer sides of both side surfaces can be exposed at the at least one location or also over a further area. In this context, exposed means that the respective outer side is not covered by a material, in particular not by one of the converter layers or another converter material. Consequently, the outer side is in direct contact with the ambient atmosphere. The ambient atmosphere may be air, but may also be of a different composition, for example in the case where the light emitting filament device is integrated into an lighting device in which the light emitting filament device is in an ambient atmosphere other than air, for example a helium environment.

An advantage of having an exposed outer side of one or both side surfaces is that heat generated by the optoelectronic components during operation of the light emitting filament device can be better dissipated to the environment, since the carrier may be made of a material, e.g. glass, that has a higher thermal conductivity than the converter layers. Consequently, the light emitting filament device can be cooled via one or both side surfaces of the carrier.

The at least one of the two side surfaces may include an angle with the first main surface in a range of 120° to 150° at the at least one location. This angular range is particularly advantageous for total internal reflection at the at least one of the two side surfaces, so that as little light as possible that has not previously passed through at least one of the converter layers exits the light emitting filament device.

The carrier can be designed at the at least one location in such a way that not only one, but both side surfaces each enclose an angle with the first main surface of more than 90°. This angle can be in a range of 120° to 150° for both side surfaces in particular. Furthermore, the respective angles of the two side surfaces can be of the same size or different sizes.

Due to the above-described design of the carrier, the width of the second main surface of the carrier at the at least one location is usually larger than the width of the first main surface on which the optoelectronic components are mounted. The carrier may be trapezoidal in cross-section at the at least one location, in particular. In this case, the cross-sectional distances of the two main surfaces run parallel to each other. Furthermore, the trapezoid spanned by the carrier in cross-section may be isosceles, which means that the cross-sectional distances of the two side surfaces are of equal length.

It can be provided that the first converter layer completely covers the first main surface of the carrier at the at least one location and, optionally, an optoelectronic component located at the at least one location. Additionally or alternatively, the second converter layer can completely cover the second main surface of the carrier at the at least one location. This embodiment prevents the light emitted by the optoelectronic components from exiting the light emitting filament device without first passing through at least one of the converter layers.

Due to the geometric design of the carrier, a total reflection can be generated at the inner side of the at least one side surface even if the carrier is made of a material having a comparatively low refractive index. For example, the carrier can be made of a transparent material having a refractive index of less than 1.7. This allows to use comparatively inexpensive materials instead of materials with a high refractive index, such as sapphire or an $Al_2O_3$ ceramic.

In particular, the carrier can be made of glass, which can have a refractive index of approximately 1.5. Furthermore, the carrier can be made of a suitable transparent plastic with a refractive index lower than 1.7, e.g. polycarbonate. When selecting the material for the carrier, it should be noted that the material should ideally have a high thermal conductivity to provide sufficient cooling of the light emitting filament device.

The optoelectronic components can be designed to generate blue light. Blue light has a wavelength approximately in the range of 450 nm to 490 nm.

In particular for blue light, phosphor can be used as a converter to generate white light from the blue light. The first converter layer and/or the second converter layer can therefore comprise phosphorus. In particular, in the form of particles, phosphorus may be embedded in a matrix, for example a silicone matrix.

A lighting device can include one or more of the light emitting filament devices as described in the present application. The lighting device can be used to illuminate buildings, rooms, particularly living and/or working spaces, outdoor areas, vehicles, equipment, or other suitable objects or spaces.

In particular, the light emitting filament device can be used in lighting devices that have the external shape of a conventional incandescent lamp, also called a filament lamp, incandescent light, or lightbulb, where the light is produced not by a wire filament but by one or more of the light emitting filament devices.

Furthermore, one or more light emitting filament devices can be integrated into a license plate lighting device for motor vehicles. A license plate lighting device serves in particular the purpose of ensuring the readability of a motor vehicle license plate in the dark. The vehicle may be a passenger car, a truck, a bus, a motorcycle or any other motor vehicle.

A method of manufacturing a light emitting filament device comprises providing a carrier extending in a longitudinal direction and having a first main surface, a second main surface opposite the first main surface, and two side surfaces interconnecting the two main surfaces. The carrier is designed in at least one location along the longitudinal direction such that at least one of the two side surfaces includes an angle with the first main surface of greater than 90°. Furthermore, the method comprises arranging optoelectronic components on the first main surface of the carrier, applying a first converter layer on the first main surface of the carrier and the optoelectronic components, and applying a second converter layer on the second main surface of the carrier.

The method of manufacturing a light emitting filament device may have the above-described embodiments of the light emitting filament device.

Figure 1B:
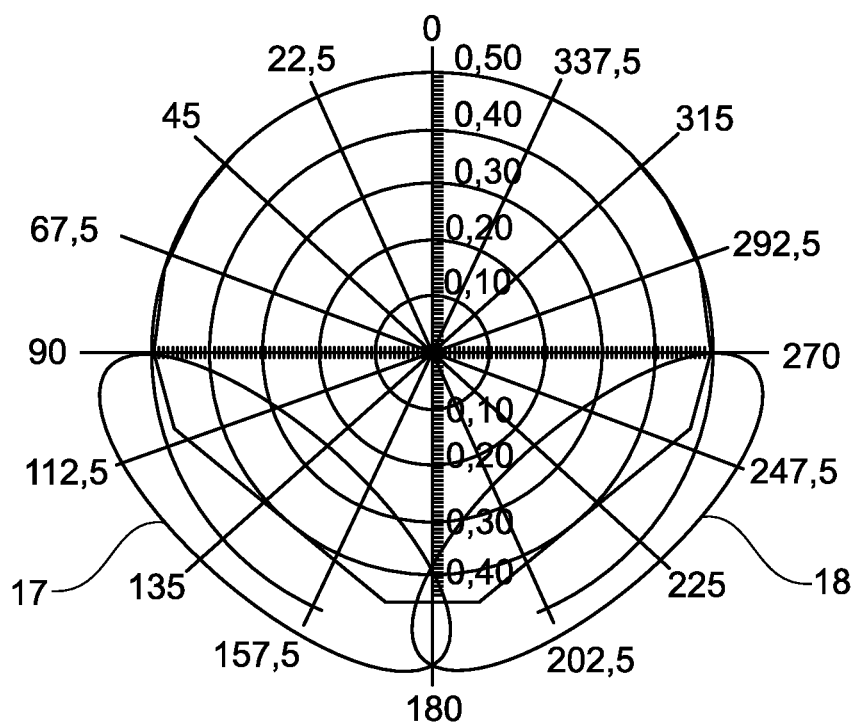
Figure 2A:
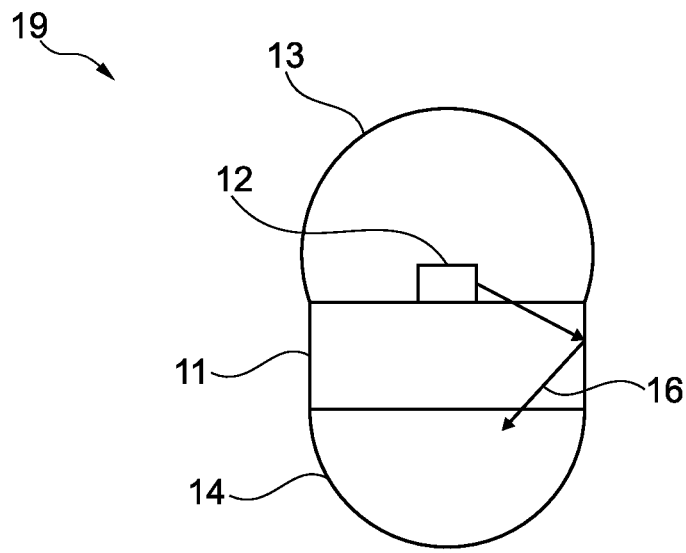
Figure 2B:
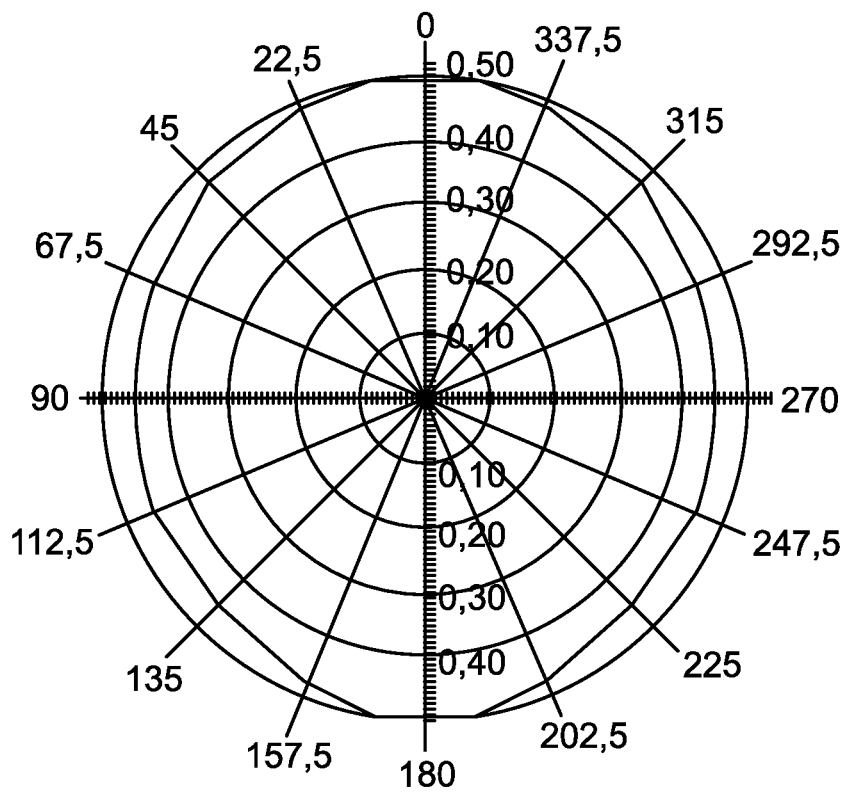
Figure 3A:
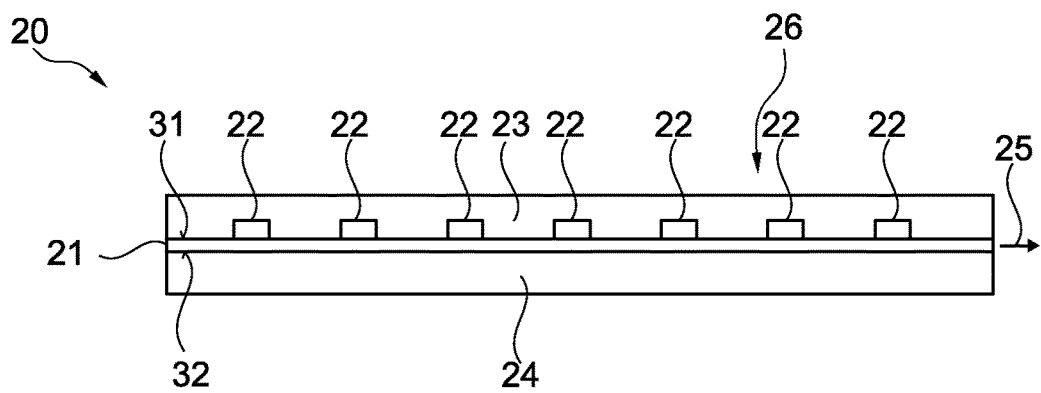
Figure 3B:
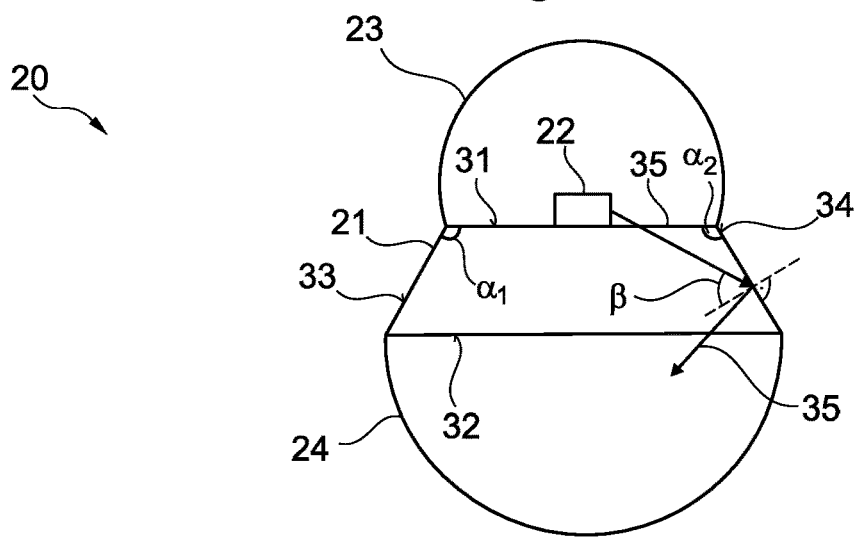
Figure 3C:
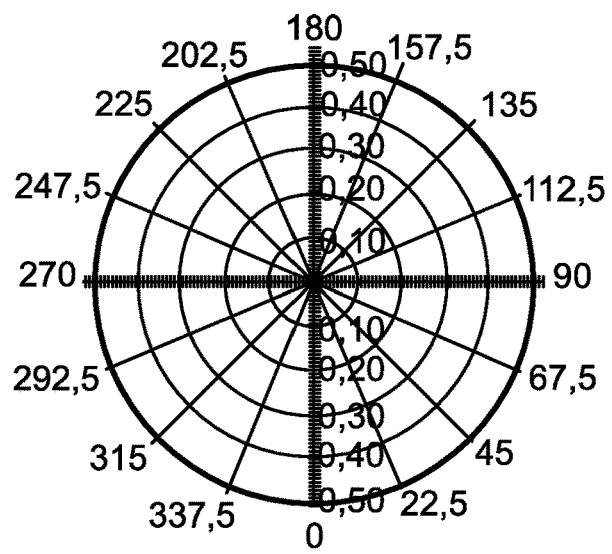
Figure 4:
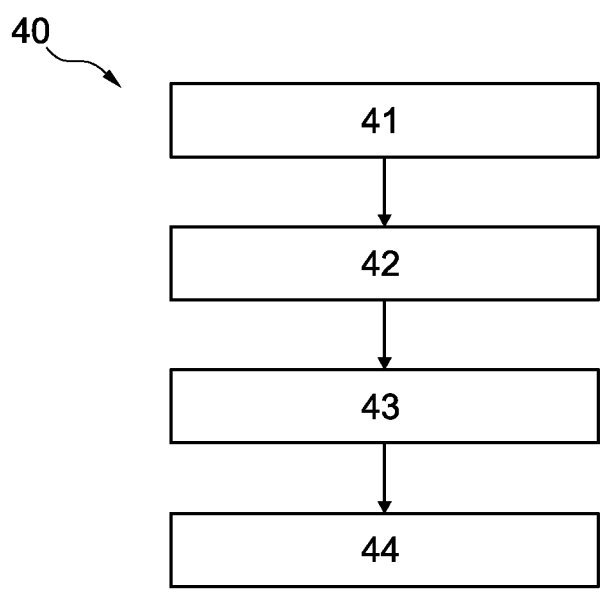

In the following, embodiments of the invention are explained in more detail with reference to the accompanying drawings. In these schematically show:

FIG. 1A An illustration of an embodiment of a light emitting filament device not according to the invention;

FIG. 1B illustration of the color homogeneity of the light emitting filament device shown in FIG. 1A;

FIG. 2A representation of another embodiment of a light emitting filament device not according to the invention;

FIG. 2B illustration of the color homogeneity of the light emitting filament device shown in FIG. 2A;

FIG. 3A representation of an embodiment of a light emitting filament device according to the invention in a cross-section along the extension of the light emitting filament device in a longitudinal direction;

FIG. 3B illustration of the light emitting filaperpendicular to the longitudinal direction;

FIG. 3C illustration of the color homogeneity of the light emitting filament device shown in FIGS. 3A and 3B; and FIG. 4 illustration of an embodiment of a method for manufacturing a light emitting filament device according to the invention.

In the following detailed description, reference is made to the accompanying drawings, which form a part of this description and in which specific embodiments in which the invention may be practiced are shown for illustrative purposes. Since components of embodiments may be positioned in a number of different orientations, the directional terminology is for illustrative purposes and is not limiting in any way. It is understood that other embodiments may be used and structural or logical changes may be made without departing from the scope of protection. It is understood that the features of the various embodiments described herein may be combined with each other, unless specifically indicated otherwise. Therefore, the following detailed description is not to be construed in a limiting sense. In the figures, identical or similar elements are provided with identical reference signs where appropriate.

FIG. 1A schematically shows a light emitting filament device 10 in a cross-section perpendicular to the longitudinal extent of the light emitting filament device 10.

The light emitting filament device 10 includes a carrier 11 and a plurality of LED semiconductor chips 12 disposed on the top surface of the carrier 11. In FIG. 1A, one of the LED semiconductor chips 12 is shown. A first converter layer 13 and a second converter layer 14 are further provided on the top and bottom surfaces of the carrier 11, respectively.

The carrier 11 is made of glass with a refractive index of 1.5 and has a rectangular cross-section. The LED semiconductor chips 12 generate blue light. Ideally, the blue light generated by the LED semiconductor chips 12 should pass through at least one of the converter layers 13, 14 so that the blue light can be converted into white light.

However, the case may arise where light emitted by the LED semiconductor chips 12 emerges laterally directly from the carrier 11 without having passed through one of the converter layers 13, 14 or with only a very short path through the converter layer 13. In this case, the refractive index difference between glass (n=1.5) and air (n=1) is not sufficient to reflect the direct blue light at the interface of glass and air. As an example, such a light beam 16, which does not experience total reflection at the interface of glass and air, is shown in FIG. 1A.

In FIG. 1B, the color of the light emitted from the light emitting filament device 10 is plotted in units of CIE-x against an angle indicating a radial position around the cross-section of the filament device 10 shown in FIG. 1A. It can be seen from FIG. 1B that there are two regions 17, 18 in which the color homogeneity is low because in these regions the light generated by the LED semiconductor chips 12 exits directly through the side surfaces of the carrier 11, and consequently the light spectrum in these regions contains a very high proportion of blue light.

FIG. 2A schematically shows a light emitting filament device 19 in a cross-section perpendicular to the longitudinal extension of the light emitting filament device 19. The light emitting filament device 19 is in large parts identical to the light emitting filament device 10 shown in FIG. 1A. The only difference is that in the light emitting filament device 19 the carrier 11 is not made of glass, but of a material with a higher refractive index, for example a refractive index of 1.75. Such a refractive index can be achieved with an $Al_2O_3$ ceramic or sapphire.

The higher refractive index difference at the interface between the carrier 11 and the air surrounding the light emitting filament device 19 ensures total reflection taking place at the interface. This is shown by way of example using the light beam 16.

Consequently, only a small amount of blue light leaves the light emitting filament device 19, which increases the color homogeneity of the light emitted from the light emitting filament device 19, as can be seen in FIG. 2B.

FIG. 3A schematically shows a light emitting filament device 20 as an example embodiment according to the invention. The light emitting filament device 20 has a carrier 21, a plurality of optoelectronic components in the form of LED semiconductor chips 22, a first converter layer 23 and a second converter layer 24.

The carrier 21 extends in a longitudinal direction 25 shown in FIG. 3A. The LED semiconductor chips 22 are mounted on the carrier 21 with a distance in the longitudinal direction 25 between adjacent LED semiconductor chips 22. For example, the distance between each adjacent LED semiconductor chip 22 may be equal.

FIG. 3B shows the cross-section of the light emitting filament device 20 at a location 26 shown in FIG. 3A along the longitudinal direction 25. The cross-section shown in FIG. 3B extends perpendicular to the longitudinal direction 25.

The carrier 21 has a first main surface 31, a second main surface 32 opposite the first main surface 31, and two side surfaces 33, 34 connecting the two main surfaces 31, 32. The LED semiconductor chips 22 are mounted on the first main surface 31 of the carrier 21.

The carrier 21 is made of glass or other transparent material having, for example, a refractive index less than 1.7.

The LED semiconductor chips 22 emit blue light. The first and second converter layers 23, 24 contain phosphor particles as conversion material in a silicone matrix.

The first converter layer 23 is applied to the first main surface 31 of the carrier 21 and covers the first main surface 31 and the semiconductor chips 22. At the location 26 and also at other locations along the longitudinal direction 25, the first converter layer 23 completely covers the first main surface 31 of the carrier 21, i.e., the first converter layer 23 extends from an outer edge of the first main surface 31 to the opposite outer edge of the first main surface 31. The side surfaces 33 and 34, respectively, abut the outer edges of the first main surface 31.

The second converter layer 24 is applied to the second main surface 32 of the carrier 21 and covers the second main surface 32. At the location 26 and also at further locations along the longitudinal direction 25, the second converter layer 24 completely covers the second main surface 32 of the carrier 21, i.e., the second converter layer 24 extends from an outer edge of the second main surface 32 to the opposite outer edge of the second main surface 32. The side surfaces 33 and 34, respectively, abut the outer edges of the second main surface 32.

The first and second converter layers 23, 24 each have the shape of a segment of a circle in cross-section, but they can also be of other shapes.

The two side surfaces 33, 34 of the carrier are exposed and not covered with converter material.

As can be seen from FIG. 3B, the cross-section of the carrier 21 is trapezoidal at the location 26 perpendicular to the longitudinal direction 25. The two main surfaces 31, 32 are parallel to each other, the second main surface 32 being wider than the first main surface 31.

The side surface 33 includes an angle $\alpha_1$ with the first main surface 31. The side surface 34 includes an angle $\alpha_2$ with the first main surface 31. The angles $\alpha_1$ and $\alpha_2$ are each measured from the inside of the first main surface 31 to the inside of the respective side surface 33 and 34. Both angles $\alpha_1$ and $\alpha_2$ are each greater than 90°, which means that the side surfaces 33 and 34 are not oriented perpendicular to the first main surface 31 as in FIGS. 1A and 2A, but comprise a slope.

In particular, the angles $\alpha_1$ and $\alpha_2$ are each in a range of 120° to 150°. Furthermore, the angles $\alpha_1$ and $\alpha_2$ in the embodiment example shown in FIGS. 3A and 3B are the same size. It is also possible to make the two angles $\alpha_1$ and $\alpha_2$ different sizes.

The carrier 21 can be configured at further locations along the longitudinal direction 25 as described above and shown schematically in FIG. 3B. In particular, the carrier 21 can comprise the described embodiment over a contiguous region.

The embodiment of the carrier 21 shown in FIG. 3B is advantageous in that light emitted from the LED semiconductor chip 22 directly toward one of the side surfaces 33, 34 falls on the respective side surface 33, 34 at an angle favorable for total internal reflection.

Total internal reflection can occur at the interface between the carrier 21 and the ambient atmosphere when the angle of incidence exceeds a certain value, called the critical angle of total internal reflection. The angle of incidence is measured against the surface normal. For a glass/air interface, the critical angle of total internal reflection is approximately 42°.

FIG. 3B illustrates an example of a light beam 35 that extends from the LED semiconductor chip 22 directly to the side surface 34 of the carrier 21 and impinges on the side surface 34 at an angle of incidence p that is greater than 42°. Accordingly, a total reflection takes place at the side surface 34 so that the light beam 35 is reflected from the inner side of the side surface 34 toward the second converter layer 24.

The total reflection taking place on the inner sides of the side surfaces 33, 34 causes only a small amount of blue light to emerge through the side surfaces 33, 34 of the carrier 21. As can be seen from FIG. 3C, this significantly increases the color homogeneity of the light emitted from the light emitting filament device 20, even though the carrier 21 is made of glass or other material having a comparatively low refractive index.

Glass is cheaper to produce than a ceramic or sapphire with a higher refractive index. In addition, glass is easier to process because it is not as hard as sapphire and a glass panel is easier to separate into individual substrates.

In particular, the light emitting filament device 20 can be used in lighting devices or license plate lighting devices for motor vehicles.

The limiting angle $\alpha_{min}$ for angles $\alpha_1$ and $\alpha_2$, above which total internal reflection occurs, depends on the refractive index $n_1$ of the material of the carrier. In the case that the surrounding medium has a refractive index of $n_2=1.0$, such as air, the limiting angles $\beta_{min}$ and $\alpha_{min}$ for angle $\beta$ and angles $\alpha_1$ and $\alpha_2$, respectively, are as follows:

| $n_1$ | $\beta_{min}$ | $\alpha_{min}$ |
|---|---|---|
| 1.1 | 65 | 155 |
| 1.2 | 56 | 146 |
| 1.3 | 50 | 140 |
| 1.4 | 46 | 136 |
| 1.5 | 42 | 132 |
| 1.6 | 39 | 129 |
| 1.7 | 36 | 126 |
| 1.8 | 34 | 124 |
| 1.9 | 32 | 122 |
| 2.0 | 30 | 120 |

FIG. 4 schematically illustrates a method 40 for manufacturing the light emitting filament device 20 shown in FIGS. 3A and 3B.

In a step 41, carrier 21 is manufactured. For example, the carrier 21 can be cut from a larger glass panel or the carrier 21 can be compression molded. The side surfaces 33, 34 of the carrier 21 preferably have a low roughness to allow total reflection. For example, the carrier 21 has a length of about 30 mm to about 45 mm. The width and thickness of the carrier 21 may be, for example, about 2 mm and about 0.9 mm, respectively. The carrier 21 may further be provided with stainless steel end contacts at its ends.

In a step 42, the LED semiconductor chips 22 are mounted on the first main surface 31 of the carrier 21.

In a step 43, the LED semiconductor chips 22 are electrically connected to each other and to the end contacts with bonding wires.

In a step 44, the first and second converter layers 23, 24 are applied to the carrier 21.

LIST OF REFERENCE SIGNS 10 light emitting filament device
11 carrier
12 LED semiconductor chip
13 first converter layer
14 second converter layer
16 light beam
17 region
18 region
19 light emitting filament device
20 light emitting filament device
21 carrier
22 LED semiconductor chip
23 first converter layer
24 second converter layer
25 longitudinal direction
26 location
31 first main surface
32 second main surface
33 side surface 34 side surface
35 light beam
40 method
41 Step
42 Step
43 Step
44 Step

The invention claimed is:

1. A light emitting filament device, comprising:
a carrier extending in a longitudinal direction and having a first main surface, a second main surface opposite the first main surface, and two side surfaces interconnecting the two main surfaces,
optoelectronic components arranged on the first main surface of the carrier,
a first converter layer disposed on the first main surface of the carrier and covering the optoelectronic components,
a second converter layer disposed on the second main surface of the carrier,
wherein the carrier is configured in at least one location along the longitudinal direction such that at least one of the two side surfaces includes an angle with the first main surface of greater than 90°, and
wherein the carrier is trapezoidal in cross-section at the at least one location.

2. The light emitting filament device of claim 1, wherein an outer side of the at least one of the two side surfaces is at least partially exposed at the at least one location.

3. The light emitting filament device of claim 1, wherein the at least one of the two side surfaces at the at least one location includes an angle with the first main surface in a range of 120° to 150°.

4. The light emitting filament device according to claim 1, wherein the carrier is designed at the at least one location such that both side surfaces each include an angle with the first main surface of greater than 90°.

5. The light emitting filament device according to claim 1, wherein the first converter layer completely covers the first main surface of the carrier at the at least one location and/or the second converter layer completely covers the second main surface of the carrier at the at least one location.

6. The light emitting filament device according to claim 1, wherein the carrier is made of a material having a refractive index lower than 1.7.

7. The light emitting filament device according to claim 1, wherein the carrier is made of glass or a plastic.

8. The light emitting filament device according to claim 1, wherein the optoelectronic components are adapted to generate blue light.

9. The light emitting filament device according to claim 1, wherein the first converter layer and/or the second converter layer comprises phosphor.

10. A lighting device comprising one or more light emitting filament devices according to claim 1.

11. A license plate lighting device for a motor vehicle comprising one or more light emitting filament devices according to claim 1.

12. A method of manufacturing a light emitting filament device, comprising the steps of:
providing a carrier which extends in a longitudinal direction and which has a first main surface, a second main surface opposite the first main surface, and two side surfaces interconnecting the two main surfaces, wherein the carrier at at least one location along the longitudinal direction is designed such that at least one of the two side surfaces includes an angle with the first main surface of greater than 90°, and wherein the carrier at the at least one location is trapezoidal in cross-section,
arranging optoelectronic components on the first main surface of the carrier,
applying a first converter layer on the first main surface of the carrier and the optoelectronic components,
applying a second converter layer to the second main surface of the carrier.

13. The method of claim 12, wherein an outer side of the at least one of the two side surfaces remains at least partially exposed at the at least one location.

14. The method of claim 12, wherein the at least one of the two side surfaces at the at least one location includes an angle with the first main surface in a range of 120° to 150°.

* * * * *